(12) United States Patent
Yano et al.

(10) Patent No.: US 9,905,752 B2
(45) Date of Patent: Feb. 27, 2018

(54) MAGNETO-RESISTANCE ELEMENT AND MAGNETIC SENSOR USING THE SAME

(71) Applicants: DENSO CORPORATION, Kariya, Aichi-pref. (JP); TOHOKU UNIVERSITY, Sendai-shi, Miyagi (JP)

(72) Inventors: Toshifumi Yano, Kariya (JP); Kenichi Ao, Kariya (JP); Yasuo Ando, Sendai (JP); Mikihiko Oogane, Sendai (JP); Takafumi Nakano, Sendai (JP)

(73) Assignees: DENSO CORPORATION, Kariya (JP); TOHOKU UNIVERSITY, Miyagi (JP)

( * ) Notice: Subject to any disclaimer, the term of this patent is extended or adjusted under 35 U.S.C. 154(b) by 32 days.

(21) Appl. No.: 14/914,267

(22) PCT Filed: Aug. 8, 2014

(86) PCT No.: PCT/JP2014/004140
§ 371 (c)(1),
(2) Date: Feb. 25, 2016

(87) PCT Pub. No.: WO2015/029348
PCT Pub. Date: Mar. 5, 2015

(65) Prior Publication Data
US 2016/0218277 A1 Jul. 28, 2016

(30) Foreign Application Priority Data

Aug. 28, 2013 (JP) .................................. 2013-176972
May 30, 2014 (JP) .................................. 2014-113020

(51) Int. Cl.
*H01L 29/82* (2006.01)
*H01L 43/08* (2006.01)
(Continued)

(52) U.S. Cl.
CPC .............. *H01L 43/08* (2013.01); *G01R 33/09* (2013.01); *G01R 33/091* (2013.01);
(Continued)

(58) Field of Classification Search
CPC .... G01R 33/09; G01R 33/091; G11C 11/161; H01L 43/08; H01L 43/10
See application file for complete search history.

(56) References Cited

U.S. PATENT DOCUMENTS

2006/0256484 A1 11/2006 Sato et al.
2008/0080102 A1 4/2008 Ibusuki et al.
(Continued)

FOREIGN PATENT DOCUMENTS

JP 2002-289943 A 10/2002
JP 2005-085821 A 3/2005
(Continued)

OTHER PUBLICATIONS

International Search Report and Written Opinion of the International Searching Authority dated Sep. 22, 2014 issued in the corresponding International application No. PCT/JP2014/004140 (and English translation).

(Continued)

*Primary Examiner* — Ismail Muse
(74) *Attorney, Agent, or Firm* — Posz Law Group, PLC

(57) ABSTRACT

A magneto-resistance element includes a resistance variable layer and a trap layer. The resistance variable layer includes the alloy having B. A resistance of the resistance variable layer changes according to a magnetic field. The trap layer is for trapping the B diffused from the resistance variable layer. With this structure, the B in the resistance variable layer becomes easily trapped in the trap layer and becomes difficult to be diffused to an outside of the magneto-resistance element. A difficulty associated with B diffusion to the (Continued)

outside of the magneto-resistance element can be prevented from occurring.

5 Claims, 3 Drawing Sheets

(51) Int. Cl.
    *H01L 43/10* (2006.01)
    *H01L 43/12* (2006.01)
    *G01R 33/09* (2006.01)
    *G11C 11/16* (2006.01)
    *H01L 43/02* (2006.01)
    *G11C 11/14* (2006.01)
    *G11C 11/15* (2006.01)
    *G11C 16/04* (2006.01)

(52) U.S. Cl.
    CPC ......... *G01R 33/093* (2013.01); *G01R 33/098* (2013.01); *G11C 11/14* (2013.01); *G11C 11/15* (2013.01); *G11C 11/161* (2013.01); *G11C 16/0466* (2013.01); *H01L 43/02* (2013.01); *H01L 43/10* (2013.01); *H01L 43/12* (2013.01)

(56) References Cited

U.S. PATENT DOCUMENTS

| | | | |
|---|---|---|---|
| 2009/0161267 A1 | 6/2009 | Kawai et al. | |
| 2011/0094875 A1* | 4/2011 | Djayaprawira | B82Y 25/00 204/192.2 |
| 2011/0102948 A1* | 5/2011 | Apalkov | G11C 11/16 360/324.2 |
| 2011/0262632 A1* | 10/2011 | Kagami | B82Y 10/00 427/123 |
| 2012/0023386 A1* | 1/2012 | Oh | H01L 43/08 714/769 |
| 2012/0061781 A1 | 3/2012 | Ohmori et al. | |
| 2012/0217595 A1* | 8/2012 | Zhou | G11C 11/16 257/421 |
| 2012/0261777 A1* | 10/2012 | Shukh | H01L 43/08 257/421 |
| 2013/0042081 A1* | 2/2013 | Park | H01L 43/08 711/154 |
| 2013/0334632 A1* | 12/2013 | Park | H01L 27/224 257/421 |
| 2014/0021426 A1* | 1/2014 | Lee | H01L 43/02 257/1 |

FOREIGN PATENT DOCUMENTS

| | | |
|---|---|---|
| JP | 2010-101885 A | 5/2010 |
| JP | 2010-127695 A | 6/2010 |
| JP | 2014-135449 A | 7/2014 |

OTHER PUBLICATIONS

Sugihara et al., "Magnetic Recording", IEICE Technical Report, The Institute of Electronics Information and Communication Engineers, vol. 112, No. 249, Oct. 18-19, 2012 (and English translation).

* cited by examiner

MAGNETO-RESISTANCE ELEMENT AND MAGNETIC SENSOR USING THE SAME

CROSS REFERENCE TO RELATED APPLICATIONS

This application is a U.S. national stage of International Application No. PCT/JP2014/004140 filed on Aug. 8, 2014 and is based on Japanese Patent Applications No. 2013-176972 filed on Aug. 28, 2013 and No. 2014-113020 filed on May 30, 2014, the disclosures of which are incorporated herein by reference.

TECHNICAL FIELD

The present disclosure relates to a magneto-resistance element comprising a layer including an alloy having B (boron) and to a magnetic sensor using the same.

BACKGROUND ART

A magneto-resistance element is conventionally used for a magnetic sensor, a memory and the like. The magneto-resistance element is a semiconductor element that uses a magneto-resistance effect, which is a change in resistance according to a magnetic field. A known magneto-resistance element comprises a layer including an alloy having B. Now, a magnetic sensor for measuring an external magnetic field application direction will be described as an example that uses the magneto-resistance element comprising a layer including an alloy having B.

A sensor including a magneto-resistance element such as a TMR (tunnel Magneto-Resistance) element and a GMR (Giant Magneto-Resistance) element is known as a magnetic sensor for measuring an external magnetic field application direction. This magneto-resistance element comprises a pin layer whose magnetized direction is fixed, a free layer whose magnetized direction changes following an external magnetic field, and an intermediate layer disposed between the pin layer and the free layer. This intermediate layer is provided by a nonmagnetic film. In particular, in the TMR element, the intermediate layer is provided by an insulator. When the external magnetic field is applied to the magneto-resistance element, a resistance between the pin layer and the free layer changes according to spin states of the pin layer and the free layer. Specifically, the resistance between the pin layer and the free layer changes according to an angle between a magnetized direction of the free layer and a magnetized direction of the pin layer. For this reason, the sensor can measure the external magnetic field application direction (application angle) by measuring an electric current value flowing in the intermediate layer between the pin layer and the free layer or the like.

For this kind of magnetic sensor, the use of CoFeB (cobalt iron boron) for the pin layer and the free layer, which are magnetic films, has been proposed (e.g., Patent Literature 1). In this magnetic sensor, after the pin layer and the free layer are formed, the pin layer and the free layer in an amorphous state are crystallized by heat-treating. Specifically, in this magnetic sensor, heat-treating after forming the pin layer and the free layer releases B from CoFeB and CoFe (cobalt iron) is used. This is done to increase a magneto-resistance change rate (MR ratio: magneto-resistance ratio) of the magnetic sensor.

PRIOR ART LITERATURES

Patent Literature

Patent Literature 1: JP 2008-85208A

SUMMARY OF INVENTION

The inventors of the present application recognize the followings regarding a magneto-resistance element.

In the above magnetic sensor using CoFeB for the pin layer and the free layer, the crystallization of the pin layer and the free layer, i.e., the release of B from CoFeB, is incomplete in some cases. In such cases, if the magnetic sensor is used under high temperature environments (e.g., about 200 degree C.), residual B in the pin layer and the free layer diffuses to an outside (the intermediate layer in the magneto-resistance element, a region outside the magneto-resistance element in the magnetic sensor). The B diffused to the outside may react with substances of other regions (wiring and the like) of an electronic circuit including the magneto-resistance element. This causes characteristics changes such as a resistance change, a sensitivity change and the like of the magneto-resistance element.

Although the difficulty resulting from the diffusion of B contained in the magneto-resistance element to an outside has been described by referring to a magnetic sensor as an illustration, the same difficulty happens when a magneto-resistance element comprising a layer including an alloy having B (boron) is used for other devices than the magnetic sensor.

In view of the foregoing, it is an object of the present disclosure to provide a structure capable of suppressing B diffusion in a magneto-resistance element that comprises a layer including an alloy having B.

A magneto-resistance element according to an example of the present disclosure comprises: a resistance variable layer that includes an alloy having B, wherein a resistance of the resistance variable layer changes according to a magnetic field; and a trap layer for trapping the B diffused from the resistance variable layer.

Because of this structure, the B in the resistance variable layer becomes easily trapped in the trap layer and becomes difficult to diffuse to an outside of the magneto-resistance element. A difficulty associated with B diffusion to the outside of the magneto-resistance element can be prevented.

EMBODIMENTS FOR CARRYING OUT INVENTION

Embodiments of the present disclosure will be described based on the drawings. In the below description of embodiments, same references are used to refer to same or similar parts.

First Embodiment

A magnetic sensor will be illustrated as an example of a device that includes a magneto-resistance element of a first embodiment. A magnetic sensor S1 of the present embodiment will be described with reference to FIGS. 1 to 3. The magnetic sensor S1 includes a magnetic resistance film layer 5 acting as a magneto-resistance element such as a TMR element and a GMR element, and measures an application direction (application angle) of an external magnetic field by measuring an electric current value flowing in an nonmagnetic intermediate layer 5b between a pin layer 5a and free layers 5c, 5d or the like. It may be preferable that this magnetic sensor S1 be applied to an angle sensor for detecting, for example, a cam angle or a crank angle of an engine.

Figure 1:
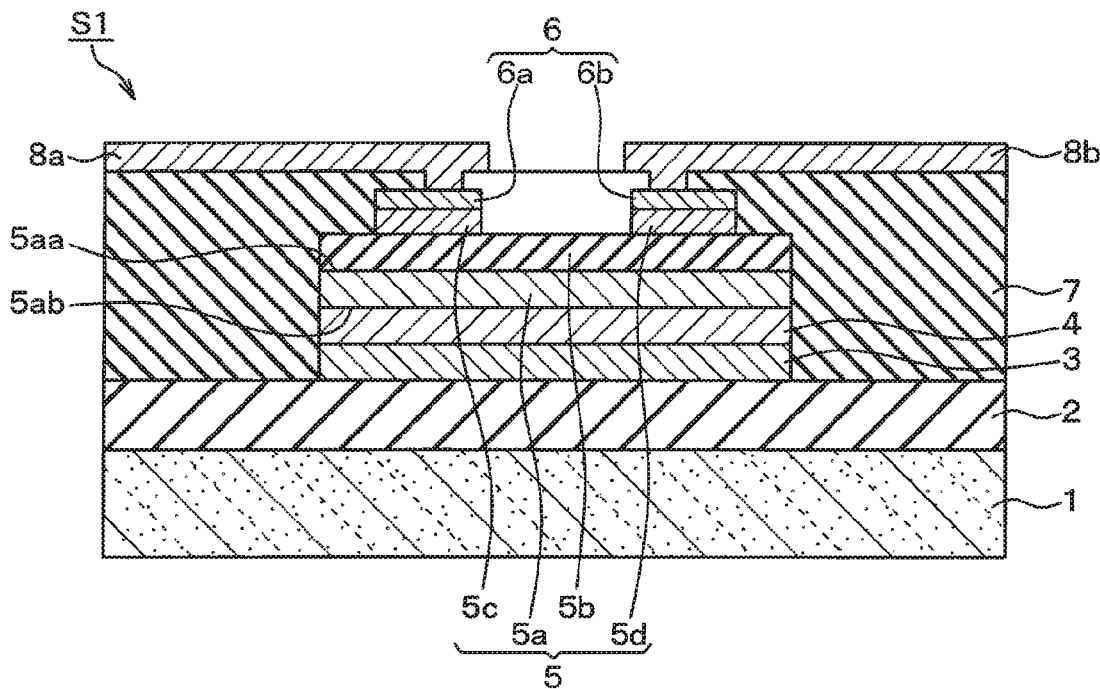
FIG. 1 is a diagram illustrating a cross section of a magnetic sensor according to a first embodiment.

In the present embodiment, as shown in FIG. 1, a base layer 2, a first wiring layer 3, a first trap layer 4, a magnetic resistance film layer 5, second trap layers 6a, 6b and second wiring layers 8a, 8b are laminated on a substrate 1 in order. Specifically a magnetic sensor S1 of the present embodiment has such a structure that the magnetic resistance film layer 5 is sandwiched between the first trap layer 4 and the second trap layer 6a, 6b. The magnetic resistance film layer 5 includes a pin layer 5a, a nonmagnetic intermediate layer 5b and a free layer 5c, 5d, which are laminated on the first trap layer 4 in this order.

The substrate 1 is a thin plate member provided by, for example, a silicon wafer etc. The base layer 2 is formed above the substrate 1.

The base layer 2 is an insulating layer made of, for example, SiO2 (silicon oxide). The base layer 2 is formed by thermal oxidation, CVD, sputtering or the like. The first wiring layer 3 is formed above the base layer 2.

The first wiring layer 3 is made of a conductive metal material such as Cu (copper), Al (aluminum)) and the like and is laminated on an opposite side of the base layer 2 from the substrate 1. The first wiring layer 3 is formed by patterning with photolithography and etching (for example, ion milling, RIE reactive ion etching) etc. The first trap layer 4 is formed above the first wiring layer 3.

The first trap layer 4 is for trapping B diffused from the below-described pin layer 5a and free layer 5c, 5d and is laminated on an opposite side of the first wiring layer 3 from the base layer 2. The first trap layer 4 is provided by a conductivity oxide film or a conductive nitride film each including, as its component, at least one element among Ta (tantalum), Ti (titanium), W (tungsten), Ru (ruthenium), Nb (niobium), V (vanadium), and Ni (nickel). The first trap layer 4 is formed by thermal oxidation, plasma oxidation, CVD, sputtering, deposition, ΔLD etc. The pin layer 5a is formed above the first trap layer 4.

The pin layer 5a is made of a ferromagnetic material, a magnetized direction of which is fixed. The pin layer 5a is laminated on an opposite side of the first trap layer 4 from the first wiring layer 3. The pin layer 5a includes an amorphous alloy that includes B and at least one of Fe (iron), Co (cobalt) and Ni (nickel). The nonmagnetic intermediate layer 5b is formed above the pin layer 5a.

The nonmagnetic intermediate layer 5b is a nonmagnetic body and is laminated on an opposite side of the pin layer 5a from the first trap layer 4 (in the below, a surface of the pin layer 5a on which the nonmagnetic intermediate layer 5b is formed is called a first surface 5aa). Because the magnetic sensor S1 includes the magnetic resistance film layer 5 as the TMR element, the nonmagnetic intermediate layer 5b includes an insulator providing a resistance that changes according to an angle between the magnetized direction of the pin layer 5a and the magnetized direction of the free layer 5c, 5d. The nonmagnetic intermediate layer 5b is made of metallic oxide such as MgO (magnesium oxide), Al2O3 (aluminum oxide), Ta2O5 (tantalum pentoxide) and the like. As shown in FIG. 1, the free layer 5c and the free layer 5d are separately formed at different positions above the nonmagnetic intermediate layer 5b.

The free layer 5c, 5d is laminated on an opposite side of the nonmagnetic intermediate layer 5b from the pin layer 5a and is a ferromagnetic body, the magnetized direction of which changes following the external magnetic field. The free layer 5c, 5d includes an amorphous state alloy that includes B and at least one of Fe, Co and Ni.

Each of the pin layer 5a, the nonmagnetic intermediate layer 5b and the free layer 5c, 5d is patterned by photolithography, etching (for example, ion milling, RIE: reactive ion etching) etc.

The second trap layer 6a is formed above the free layer 5c and the second trap layer 6b is formed above the free layer 5d. These second trap layers 6a, 6b are for trapping B diffused from the free layers 5c, 5d and the pin layer 5a and are laminated on an opposite side of the free layers 5c, 5d from the nonmagnetic intermediate layer 5b. Like the first trap layer 4, the second trap layer 6a, 6b includes an conductive oxide or nitride film that includes, as a component thereof, at least one element selected from a group consisting of Ta, Ti, W, Ru, Nb, V and Ni. Like the first trap layer 4, the second trap layer 6a, 6b is formed by thermal oxidation, plasma oxidation, CVD, sputtering, deposition, ALD etc.

In the present embodiment, an interlayer insulating layer 7 is formed to cover the base layer 2, the first wiring layer 3, the first trap layer 4 and the magnetic resistance film layer 5. A second wiring layer 8a and a second wiring layer 8b are formed above the interlayer insulating layer 7.

The second wiring layer 8a is connected to the second trap layer 6a through a contact hole formed in the interlayer insulating layer 7. The second wiring layer 8b is connected to the second trap layer 6b through a contact hole formed in the interlayer insulating layer 7. The second wiring layers 8a, 8b are formed on an opposite side from the substrate 1 to cover the interlayer insulating layer 7. The second wiring layers 8a, 8b are made of a conductive metal material such as Cu, Al and the like, and are laminated on an opposite side of the second trap layers 6a, 6b from the free layer 5c. The second wiring layers 8a, 8b are formed by patterning with photolithography, etching (for example, ion milling, RIE: reactive ion etching) or the like.

As can be seen from the above, the magnetic resistance film layer 5 includes, like a conventional magnetic resistance element, a structure in which the free layers 5c, 5d are disposed on the first surface (5aa in FIG. 1) side of the pin layer 5a and the nonmagnetic intermediate layer 5b is disposed between the pin layer 5a and the free layers 5c, 5d.

The magnetic sensor S1 of the present embodiment includes the first trap layer 4 and the second trap layers 6a, 6b which are provided as the conductive oxide or nitride films for trapping the diffusing B. The first trap layer 4 is disposed to contact with the pin layer 5a at a second surface (5ab in FIG. 1) of the pin layer 5a opposite to the first surface 5aa The second trap layers 6a, 6b are disposed to contact with the free layers 5c, 5d at surfaces 5ca of the free layers 5c, 5d opposite to surfaces 5cb facing the nonmagnetic intermediate layer 5b.

Figure 2:
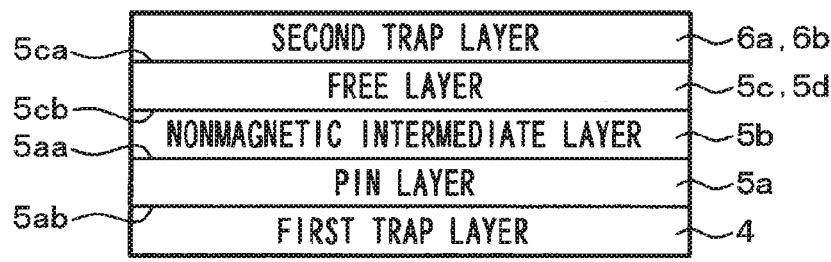
FIG. 2 is a diagram schematically illustrating a lamination relation among a pin layer, a nonmagnetic intermediate layer, a free layer and a trap layer of a magnetic sensor illustrated in FIG. 1.

FIG. 2 schematically illustrates a lamination relationship among the pin layer 5a, the nonmagnetic intermediate layer 5b, the free layers 5c, 5d and the trap layers 4, 6a, 6b in the magnetic sensor S1 of the present embodiment. Specifically, the first trap layer 4, the pin layer 5a, the nonmagnetic intermediate layer 5b, the free layers 5c, 5d and the second trap layers 6a, 6b are laminated in this order in the magnetic sensor S1 of the present embodiment.

A structure of the magnetic sensor S1 of the present embodiment has been illustrated above. It is noted that the magnetic sensor S1 of the present embodiment is manufactured through forming the pin layer 5a, the nonmagnetic intermediate layer 5b and the free layers 5c, 5d and thereafter applying the heat treatment to crystalize the free layers 5c, 5d and the pin layer 5a in the amorphous state. For example, this heat treatment is performed for approximately one hour under a temperature of approximately 275 degrees C. and a magnetic field of 1 T.

Next, an electric circuit configuration of the magnetic sensor S1 of the present embodiment will be described.

Figure 3:
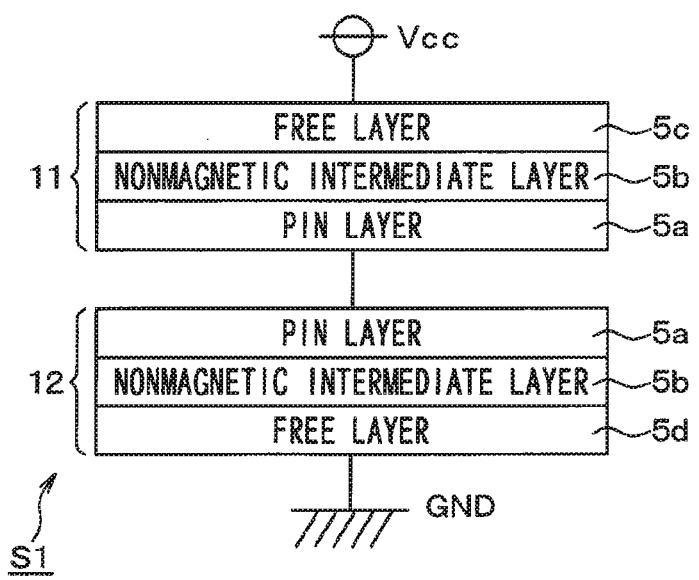
FIG. 3 is a diagram illustrating an equivalent circuit of a magnetic sensor illustrated in FIG. 1.

As shown in FIG. 3, the free layer 5c is connected to a power source Vcc and the free layer 5d is connected to ground. In the present embodiment, the free layer 5c, the pin layer 5a and the nonmagnetic intermediate layer 5b constitute the TMR element 11. The free layer 5d, the pin layer 5a and the nonmagnetic intermediate layer 5b constitute the TMR element 12. In this way, the TMR elements 11, 12 are connected in series between the power source Vcc and the ground.

Next, an operation and a technical effect of the magnetic sensor S1 of the present embodiment will be described.

As described above, the magnetic sensor S1 of the present embodiment includes the first trap layer 4, which is provided as the conductive oxide or nitride film for trapping the diffused B. The first trap layer 4 is disposed to contact with the pin layer 5a at the second surface (5ab in FIG. 1) of the pin layer 5a opposite to the first surface 5aa.

Because of this structure, among the B remaining inside the pin layer 5a, the B diffused from the second surface 5ab of the pin layer 5a to the outside of the pin layer 5a is diffused into the first trap layer 4 under high temperature environments. Then, the B diffused into the first trap layer 4 is combined with O (oxygen) inside the first trap layer 4 (combined with N (nitrogen) when the first trap layer 4 is a conductive nitride film) to form BOx in the first trap layer 4 (to form BNx when the first trap layer 4 is a conductive nitride film). The BOx formed inside the first trap layer 4 is thermally stable. Because it is difficult for atoms in a thermally stable region to diffuse, the B diffused into the first trap layer 4 after the BOx (or BNx) formation is hard to diffuse. Specifically, in the present embodiment, the BOx (or BNx) formed inside the first trap layer 4 suppresses the diffusion of B inside the first trap layer 4 under high temperature environments. Therefore, the B diffused into the first trap layer 4 out of the B remaining in the pin layer 5a etc. is easily trapped in the first trap layer 4 and is hard to diffuse to the outside of the first trap layer 4. Accordingly, in the present embodiment, even when the B remaining in the pin layer 5a and the like is diffused from the second surface 5ab of the pin layer 5a to the outside of the pin layer 5a under high temperature environments, it hardly released to the outside of the magnetic resistance film layer 5. A characteristics change resulting from the B diffusion under high temperature environments is minimized.

Moreover, the first trap layer 4 of the present embodiment includes the conductive oxide film or conductive nitride film that includes, as its component, at least one element selected from a group consisting of Ta, Ti, W, Ru, Nb, V, and Ni. Specifically, the first trap layer 4 of the present embodiment is made of a material that has a higher melting point than Ti which is a material of a cap layer of the magnetic sensor described in Patent Literature 1.

Thus, the first trap layer 4 of the present embodiment has a high heat resistance. In the present embodiment, this first trap layer 4 functions as a protection film that protects the magnetic resistance film layer 5 against heat and oxidation. In consideration of this protection film function, it is particularly preferable that the first trap layer 4 include the conductive oxide film or conductive nitride film that includes, as its component, Ta, which is a material having a high melting point and a high heat resistance.

Although the magnetic sensor described in Patent Literature 1 includes the cap layer made of Ti above the free layer, Ti is a material having a low melting point, and thus, this cap layer does not suffice as a protection film which protects the magnetic resistance element. Therefore, in order to protect the magnetic resistance element of the magnetic sensor of Patent Literature 1 against heat and oxidation, it is necessary to take additional measures such as providing an additional protection film having a sufficient heat resistance.

Moreover, the magnetic sensor S1 of the present embodiment includes the second trap layer 6a, 6b that includes the conductive oxide film or the conductive nitride film for trapping the diffused B. The second trap layer 6a, 6b is disposed to contact with the free layer 5c, 5d at the surface 5ca of the free layer 5c, 5d, where the surface 5ca is opposite to the surfaces facing the nonmagnetic intermediate layer 5b.

Because of this structure of the present embodiment, when used under high temperature environments, out of the B remaining in the free layer 5c, 5d, the B diffused from the surface 5ca of the free layer 5c, 5d to the outside of the free layer 5c, 5d is diffused into the second trap layer 6a, 6b. Accordingly, Box (BNx when the second trap layer 6a, 6b is the conductive nitride layer) is formed in the second trap layer 6a, 6b as is the case in the first trap layer 4. B diffused into the second trap layer 6a, 6b after BOx (or BNx) formation is hardly diffused inside the second trap layer 6a, 6b. For this reason, the B remaining in the free layer 5c, 5d etc. and diffused into the second trap layer 6a, 6b is easily trapped in the second trap layer 6a, 6b and is hardly diffused to the outside of the second trap layer 6a, 6b. Therefore, even when the B remaining in the free layer 5c, 5d etc. is diffused from the surface 5ca of the free layer 5c, 5d to the outside of the free layer 5c, 5d under high temperature environments, it hardly releases to the outside of the magnetic resistance film layer 5. A characteristics change resulting from the B diffusion under high temperature environments is further minimized.

Moreover, like the first trap layer 4, the second trap layer 6a, 6b of the present embodiment is provided by a conductivity oxide film or a conductive nitride film each including, as its component, at least one element among Ta, Ti, W, Ru, Nb, V, and Ni. Specifically, the second trap layer 6a, 6b of the present embodiment is made of a material that has a higher melting point than Ti which is a material of a cap layer of the magnetic sensor described in Patent Literature 1.

Thus, the second trap layer 6a, 6b of the present embodiment has a high heat resistance. In the present embodiment, this second trap layer 6a, 6b functions as a protection film that protects the magnetic resistance film layer 5 against high temperatures. In consideration of this protection film function, it is particularly preferable that the second trap layer 6a, 6b include the conductive oxide film or conductive nitride film that includes, as its component, Ta, which is a material having a high melting point and a high heat resistance.

Second Embodiment

A second embodiment will be described. This embodiment is an addition of a third trap layer 13 and a fourth trap layer 14 to the first embodiment. With regard to other points, the present embodiment is the same as the first embodiment. A difference from the first embodiment will be described.

Figure 4:
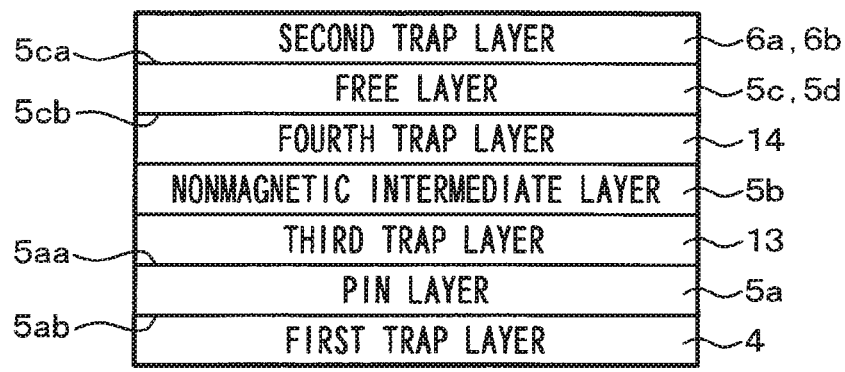
FIG. 4 is a diagram schematically illustrating a lamination relation among a pin layer, a nonmagnetic intermediate layer, a free layer and a trap layer of a magnetic sensor according to a second embodiment.

The first embodiment has a structure illustrated in FIG. 2 in which the first trap layer 4, the pin layer 5a, the nonmagnetic intermediate layer 5b, the free layers 5c, 5d and the second trap layers 6a, 6b are laminated in this order. By contrast, the present embodiment has a structure illustrated in FIG. 4 in which the third trap layer 13 and the fourth trap layer 14 are added and in which the first trap layer 4, the pin layer 5a, the third trap layer 13, the nonmagnetic intermediate layer 5b, the fourth trap layer 14, the free layers 5c, 5d and the second trap layer 6a, 6b are laminated in this order. Specifically, in the present embodiment, the third trap layer 13 is disposed between the pin layer 5a and the nonmagnetic intermediate layer 5b and the fourth trap layer 14 is disposed between the nonmagnetic intermediate layer 5b and the free layer 5c, 5d.

Like the first trap layer 4 and the second trap layer 6a, 6b, the third trap layer 13 and the fourth trap layer 14 are for trapping the B diffused from the free layer 5c, 5d and the pin layer 5a. The third trap layer 13 is disposed to contact with the pin layer 5a at the first surface 5aa of the pin layer 5a. The fourth trap layer 14 is disposed to contact with the free layer 5c, 5d at a surface 5cb of the free layer 5c, 5d. The surface 5cb faces the nonmagnetic intermediate layer 5b.

Like the first trap layer 4 etc., each of the third trap layer 13 and the fourth trap layer 14 includes the conductive oxide film or conductive nitride film that includes, as its component, at least one element among Ta, Ti, W, Ru, Nb, V, and Ni. Like the first trap layer 4 etc., each of the third trap layer 13 and the fourth trap layer 14 is formed by thermal oxidation, plasma oxidation, CVD, sputtering, deposition, ALD etc.

As described above, the magnetic sensor S1 of the present embodiment includes the third trap layer 13 which is provided as the conductive oxide or nitride film for trapping the diffusing B. The third trap layer 13 is disposed to contact with the pin layer 5a at the first surface 5aa of the pin layer 5a.

Because of this structure, when used under high temperature environments, out of the B remaining in the pin layer 5a, the B diffused from the first surface 5aa of the pin layer 5a to the outside of the pin layer 5a is diffused into the third trap layer 13. Accordingly, Box (BNx when the third trap layer 13 is the conductive nitride layer) is formed in the third trap layer 13 as is the case in the first trap layer 4 etc. The B diffused into the third trap layer 13 after the BOx (or BNx) formation is hardly diffused inside the third trap layer 13. For this reason, the B remaining in the pin layer 5a etc. and diffused into the third trap layer 13 is easily trapped in the third trap layer 13 and is hardly diffused to the outside of the third trap layer 13. Therefore, even when the B remaining in the pin layer 5a etc. is diffused from the first surface 5aa of the pin layer 5a to the outside of the pin layer 5a under high temperature environments, it hardly releases to the inside of the nonmagnetic intermediate layer 5b etc. A characteristics change resulting from the B diffusion under high temperature environments is further minimized.

Moreover, the magnetic sensor S1 of the present embodiment includes the fourth trap layer 14 which is provided as the conductive oxide or nitride film for trapping the diffusing B. The fourth trap layer 14 is disposed to contact with the free layer 5c, 5d at the surface 5cb of the free layer 5c, 5d. The surface 5cb faces the nonmagnetic intermediate layer 5b.

Because of this structure, when used under high temperature environments, out of the B remaining in the free layer 5c, 5d, the B diffused from the surface 5cb of the free layer 5c, 5d to the outside of the free layer 5c, 5d is diffused into the fourth trap layer 14. Accordingly, Box (BNx when the third trap layer 13 is the conductive nitride layer) is formed in the fourth trap layer 14 as is the case in the first trap layer 4 etc. The B diffused into the fourth trap layer 14 after the BOx (or BNx) formation is hardly diffused inside the fourth trap layer 14. For this reason, the B remaining in the free layer 5c, 5d etc. and diffused into the fourth trap layer 14 is easily trapped in the fourth trap layer 14 and is hardly diffused to the outside of the fourth trap layer 14. Therefore, in the present embodiment, even when the B remaining in the free layer 5c, 5d etc. is diffused from the surface 5cb of the free layer 5c, 5d to the outside of the free layer 5c, 5d under high temperature environments, it hardly releases to the inside of the nonmagnetic intermediate layer 5b etc. A characteristics change resulting from the B diffusion under high temperature environments is further minimized.

Moreover, like the first trap layer 4 etc., each of the third trap layer 13 and the fourth trap layer 14 is the conductivity oxide film or the conductive nitride film and includes, as its component, at least one element among Ta, Ti, W, Ru, Nb, V, and Ni.

Therefore, like the first trap layer 4 etc., the third trap layer 13 and the fourth trap layer 14 of the present embodiment have a high heat resistance and this first trap layer functions as a protection film that protects the magnetic resistance film layer 5 against high temperatures in the present embodiment. It is preferable that the third trap layer 13 and the fourth trap layer 14 each include the conductive oxide film or conductive nitride film that includes, as its component, Ta, which is a material having a high melting point and a high heat resistance.

Other Embodiment

Embodiments of the present disclosure are not limited to the above-illustrated embodiments. Modifications can be made appropriately.

Figure 5:
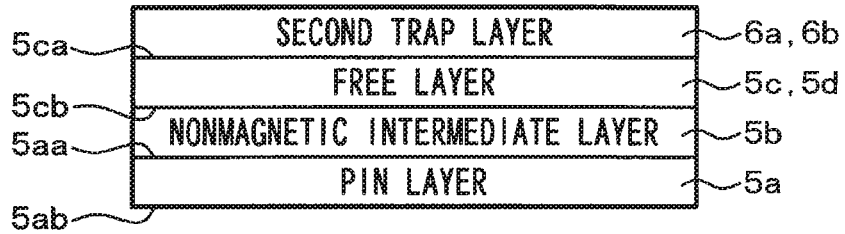
FIG. 5 is a diagram schematically illustrating a lamination relation among a pin layer, a nonmagnetic intermediate layer, a free layer and a trap layer of a magnetic sensor according to another embodiment.
Figure 6:
FIG. 6 is a diagram schematically illustrating a lamination relation among a pin layer, a nonmagnetic intermediate layer, a free layer and a trap layer of a magnetic sensor according to yet another embodiment.
Figure 7:
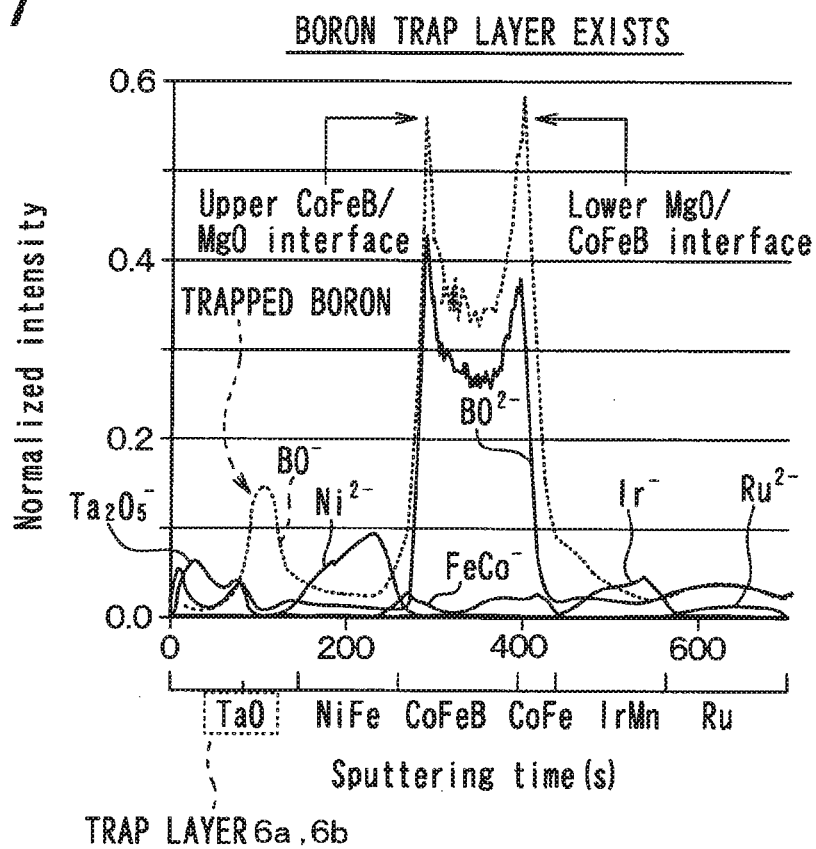
FIG. 7 is a diagram illustrating results of SIMS analysis performed to a structure in which the first trap layer 4 is removed and only second trap layers 6a, 6b are provided in the first embodiment.
Figure 8:
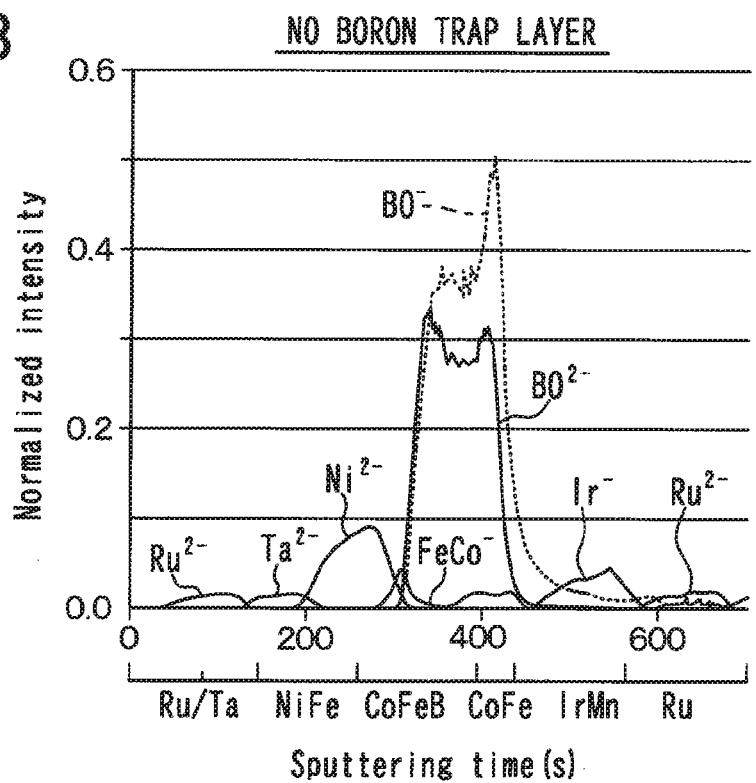
FIG. 8 is a diagram illustrating results of SIMS analysis performed to a structure in which a trap layer is absent.

The first embodiment and the second embodiment may include, among the trap layers 4, 6a, 6b, 13, 14, only one(s). For example, as shown in FIG. 5, the first embodiment may not be provided with the first trap layer 4 and may be provided with only the second trap layer 6a, 6b. As shown in FIG. 6, the first embodiment may not be provided with the second trap layer 6a, 6b and may be provided with only the first trap layer 4. FIG. 7 is a diagram illustrating results of SIMS (Secondary Ion Mass Spectrometry) analysis performed to the first embodiment that is provided with only the second trap layer 6a, 6b (specifically, the trap layer is provided on only a most outer surface). FIG. 8 is a diagram illustrating results of SIMS analysis performed to a structure in which the trap layer is absent. As shown in FIG. 7, when the trap layer (second trap layer 6a, 6b) is present, BO-ions were released from the trap layer 6a, 6b as a result of sputtering the trap layer provided on the outer most surface (see FIG. 7 for iconic strength of "TaO"). This result of SIMS analysis shown in FIG. 7 confirms that the BO-ions were detected from the trap layer and the B was trapped in the trap layer 6a, 6b.

In the above embodiments, the pin layer 5a and the free layer 5c, 5d include an alloy that has B and at least one of Fe, Co and Ni. However, the invention is not limited to this structure. Only either one of the pin layer 5a and the free layer 5c, 5d may include an alloy that has B and at least one of Fe, Co and Ni. In this case, the trap layer 4, 6a, 6b, 13, 14 for trapping B may be disposed to contact with, of the pin layer 5a and the free layer 5c, at least a layer including an alloy having B and at least one of Fe, Co and Ni (the pin layer 5a or the free layer 5c, 5d). As structures other than a structure including an alloy having B and at least one of Fe, Co and Ni, various known materials of magnetic films may be used.

In the first and second embodiments, the trap layer (the first to fourth trap layers 6a, 6b, 13, 14) for trapping B is provided as the conductivity oxide film or the conductive nitride film each including, as its component, at least one element among Ta, Ti, W, Ru, Nb, V, and Ni. Alternatively, the trap layer 6a, 6b, 13, 14 may be provided as a conductivity oxide film or a conductive nitride film each including, as its component, other metal element having a body-centered cubic lattice structure than these elements.

In the first and second embodiments, the trap layer (the first to fourth trap layers 6a, 6b, 13, and 14) for trapping B is provided in the magnetic sensor S1. In the above, because these trap layers 6a, 6b, 13, 14 are not only for blocking the diffusion of B but trapping B, these can suppress the diffusion of B to an outside as long as these are included in the magneto-resistance element (magnetic resistance film layer 5). Therefore, as long as the trap layer is included in the magneto-resistance element (magnetic resistance film layer 5), it location is not necessarily limited.

Additionally, this trap layer 6a, 6b, 13, 14 for trapping B is not dedicated to the magnetic sensor S1 and may be provided in other devices than the magnetic sensor S1. Specifically, other devices (for example, memory) including the magneto-resistance element than the magnetic sensor S1 may have a structure that includes: the magneto-resistance element comprising a layer (the pin layer 5a and the free layer 5c, 5d in the cases of the first and second embodiment) including an alloy having B; a layer 5a, 5c, 5d whose resistance changes according to a magnetic field; and a trap layer (the first trap layer 6a or the like). In such cases, when B contained in the layer whose resistance changes is diffused, this B is easily trapped in the trap layer, and it is difficult for the B contained in the magneto-resistance element (the layer including the alloy) to diffuse and release to the outside of the magneto-resistance element. In this case also, the difficulty arising from the diffusion of B to the outside of the magneto-resistance element is prevented from occurring.

Although embodiments and structures according to the present disclosure have been illustrated, embodiments and structures according to the present disclosure are not limited to respective embodiments and structures illustrated above. For example, embodiments and structures obtained by appropriately combining technical parts disclosed in different embodiments and structures are also included in embodiments and structures according to the present disclosure.

The invention claimed is:

1. A magnetic sensor comprising:
a continuous pin layer that has a first surface and a second surface opposite to the first surface, a magnetized direction of the pin layer being fixed;
a free layer disposed on a first surface side of the pin layer, the free layer including first and second free layer portions that are separated from each other in a direction parallel to the first surface of the pin layer, and each of the first and second free layer portions has a magnetized direction changing and following an external magnetic field; and
a nonmagnetic intermediate layer disposed between the pin layer and the first and second free layer portions, a resistance of the nonmagnetic intermediate layer changing according to an angle between the magnetized direction of the pin layer and the magnetized direction of each of the first and second free layer portions,
wherein:
the magnetic sensor is configured to measure an application direction of the external magnetic field based on the resistance between the pin layer and each of the first and second free layer portions; and
at least one of the pin layer and the first and second free layer portions includes a B-containing alloy which comprises B and at least one of Fe, Co, and Ni,
the magnetic sensor further comprising:
a trap layer that is disposed to contact with the at least one of the pin layer and the first and second free layer portions that includes the B-containing alloy, wherein the trap layer is a member selected from the group consisting of a conductive oxide film and a conductive nitride film configured to trap the B diffused from the pin layer or the first and second free layer portions that includes the B-containing alloy, and each of the conductive oxide film and the conductive nitride film contains Ta,
the trap layer is provided at least as a first trap layer and a second trap layer;
the first trap layer is disposed on the second surface of the pin layer;
the second trap layer includes first and second trap layer portions that are separated from each other in the direction parallel to the first surface of the pin layer and are disposed on a surface of the first and second free layer portions opposite to a surface facing the nonmagnetic intermediate layer, and
two wiring layers are disposed on and connected to the first and second trap layer portions respectively, and the two wiring layers are separated from each other in the direction parallel to the first surface of the pin layer.

2. The magnetic sensor according to claim 1, wherein the trap layer is the conductive oxide film made of a tantalum oxide.

3. The magnetic sensor according to claim 1, wherein the trap layer is the conductive nitride film made of a tantalum nitride.

4. The magnetic sensor according to claim 1, wherein:
the trap layer is the conductive oxide film made of a tantalum oxide; and
the nonmagnetic intermediate layer is an insulator made of tantalum pentoxide.

5. The magneto-resistance element according to claim 1, wherein
the B-containing alloy has a crystalline structure, and
the at least one of the pin layer and the first and second free layer portions that includes the B-containing alloy comprises residual amorphous B, the residual amorphous B diffusing from the at least one of the pin layer and the free layer in an environment of about 200° C.

* * * * *